(12) United States Patent
Rofougaran (10) Patent No.: US 7,627,294 B2
(45) Date of Patent: Dec. 1, 2009

(54) RADIO TRANSMITTER FRONT-END WITH AMPLITUDE AND PHASE CORRECTION AND METHODS FOR USE THEREWITH

(75) Inventor: Ahmadreza (Reza) Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 514 days.

(21) Appl. No.: 11/712,071

(22) Filed: Feb. 27, 2007

(65) Prior Publication Data

US 2008/0207147 A1   Aug. 28, 2008

(51) Int. Cl.
*H04B 1/06* (2006.01)
(52) U.S. Cl. .................... 455/114.3; 455/126
(58) Field of Classification Search ............ 455/91, 455/103, 108, 110, 114.1–114.3, 115.1, 126; 330/10, 149, 297
See application file for complete search history.

(56) References Cited

U.S. PATENT DOCUMENTS

| | | | |
|---|---|---|---|
| 4,618,999 A | * | 10/1986 | Watkinson .................. 455/108 |
| 2007/0298734 A1 | * | 12/2007 | Woo et al. ................. 455/114.3 |
| 2009/0081968 A1 | * | 3/2009 | Vinayak et al. ............. 455/110 |

* cited by examiner

*Primary Examiner*—Thanh C Le
(74) *Attorney, Agent, or Firm*—Garlick Harrison & Markison; Bruce E. Stuckman (57) ABSTRACT

A radio transmitter front-end for use in a voice data and RF integrated circuit (IC) includes a phase correction module that produces a phase adjusted signal in response to a phase modulated signal and at least one phase correction signal. An amplitude correction module produces an amplitude adjusted signal in response to an amplitude modulating signal and an amplitude correction signal. An amplifier amplifies the phase adjusted signal and amplitude modulates the phase adjusted signal, based on the amplitude adjusted signal, to produce a polar coordinate transmit signal. A correction generation module generates the at least one phase correction signal and the amplitude correction signal, based on the polar coordinate transmit signal and the phase adjusted signal.

22 Claims, 11 Drawing Sheets

RADIO TRANSMITTER FRONT-END WITH AMPLITUDE AND PHASE CORRECTION AND METHODS FOR USE THEREWITH

BACKGROUND OF THE INVENTION

1. Technical Field of the Invention

This invention relates generally to mobile communication devices and more particularly to a circuit for managing power in a combined voice, data and RF integrated circuit.

2. Description of Related Art

Communication systems are known to support wireless and wire line communications between wireless and/or wire line communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), radio frequency identification (RFID), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna through an antenna interface and includes a low noise amplifier, one or more intermediate frequency stages, a filtering stage, and a data recovery stage. The low noise amplifier (LNA) receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

RF transmitters can generate polar coordinate transmissions that are simultaneously amplitude modulated and phase modulated to carry more data over a single transmitted signal. The can be performed in two phases with phase modulation occurring first in a phase locked loop and amplitude modulation being induced on the phase modulated signal by the power amplifier. Both phase modulation and amplitude modulation errors can be introduced by the power amplifier during amplitude modulation based on the properties of the device. Further limitations and disadvantages of conventional and traditional approaches will become apparent to one of ordinary skill in the art through comparison of such systems with the present invention.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
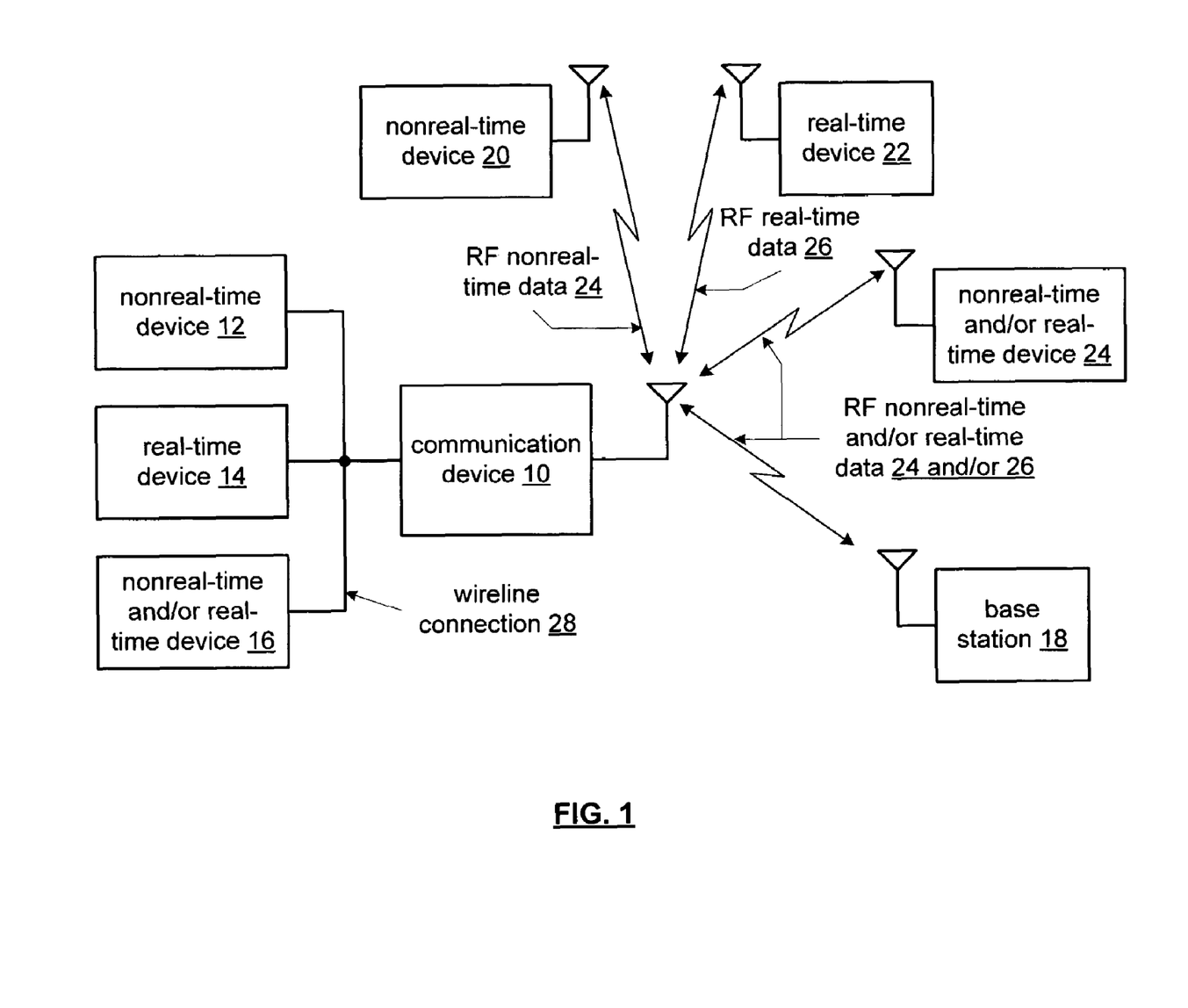
FIG. 1 is a schematic block diagram of an embodiment of a communication system in accordance with the present invention.

FIG. 1 is a schematic block diagram of an embodiment of a communication system in accordance with the present invention. In particular a communication system is shown that includes a communication device 10 that communicates real-time data 24 and non-real-time data 26 wirelessly with one or more other devices such as base station 18, non-real-time device 20, real-time device 22, and non-real-time and/or real-time device 24. In addition, communication device 10 can also optionally communicate over a wireline connection with non-real-time device 12, real-time device 14 and non-real-time and/or real-time device 16.

In an embodiment of the present invention the wireline connection 28 can be a wired connection that operates in accordance with one or more standard protocols, such as a universal serial bus (USB), Institute of Electrical and Electronics Engineers (IEEE) 488, IEEE 1394 (Firewire), Ethernet, small computer system interface (SCSI), serial or parallel advanced technology attachment (SATA or PATA), or other wired communication protocol, either standard or proprietary. The wireless connection can communicate in accordance with a wireless network protocol such as IEEE 802.11, Bluetooth, Ultra-Wideband (UWB), WIMAX, or other wireless network protocol, a wireless telephony data/voice protocol such as Global System for Mobile Communications (GSM), General Packet Radio Service (GPRS), Enhanced Data Rates for Global Evolution (EDGE), Personal Communication Services (PCS), or other mobile wireless protocol or other wireless communication protocol, either standard or proprietary. Further, the wireless communication path can include separate transmit and receive paths that use separate carrier frequencies and/or separate frequency channels. Alternatively, a single frequency or frequency channel can be used to bi-directionally communicate data to and from the communication device 10.

Communication device 10 can be a mobile phone such as a cellular telephone, a personal digital assistant, game console, personal computer, laptop computer, or other device that performs one or more functions that include communication of voice and/or data via wireline connection 28 and/or the wireless communication path. In an embodiment of the present invention, the real-time and non-real-time devices 12, 14 16, 18, 20, 22 and 24 can be personal computers, laptops, PDAs, mobile phones, such as cellular telephones, devices equipped with wireless local area network or Bluetooth transceivers, FM tuners, TV tuners, digital cameras, digital camcorders, or other devices that either produce, process or use audio, video signals or other data or communications.

In operation, the communication device includes one or more applications that include voice communications such as standard telephony applications, voice-over-Internet Protocol (VoIP) applications, local gaming, Internet gaming, email, instant messaging, multimedia messaging, web browsing, audio/video recording, audio/video playback, audio/video downloading, playing of streaming audio/video, office applications such as databases, spreadsheets, word processing, presentation creation and processing and other voice and data applications. In conjunction with these applications, the real-time data 26 includes voice, audio, video and multimedia applications including Internet gaming, etc. The non-real-time data 24 includes text messaging, email, web browsing, file uploading and downloading, etc.

In an embodiment of the present invention, the communication device 10 includes an integrated circuit, such as a combined voice, data and RF integrated circuit that includes one or more features or functions of the present invention. Such integrated circuits shall be described in greater detail in association with FIGS. 3-12 that follow.

Figure 2:
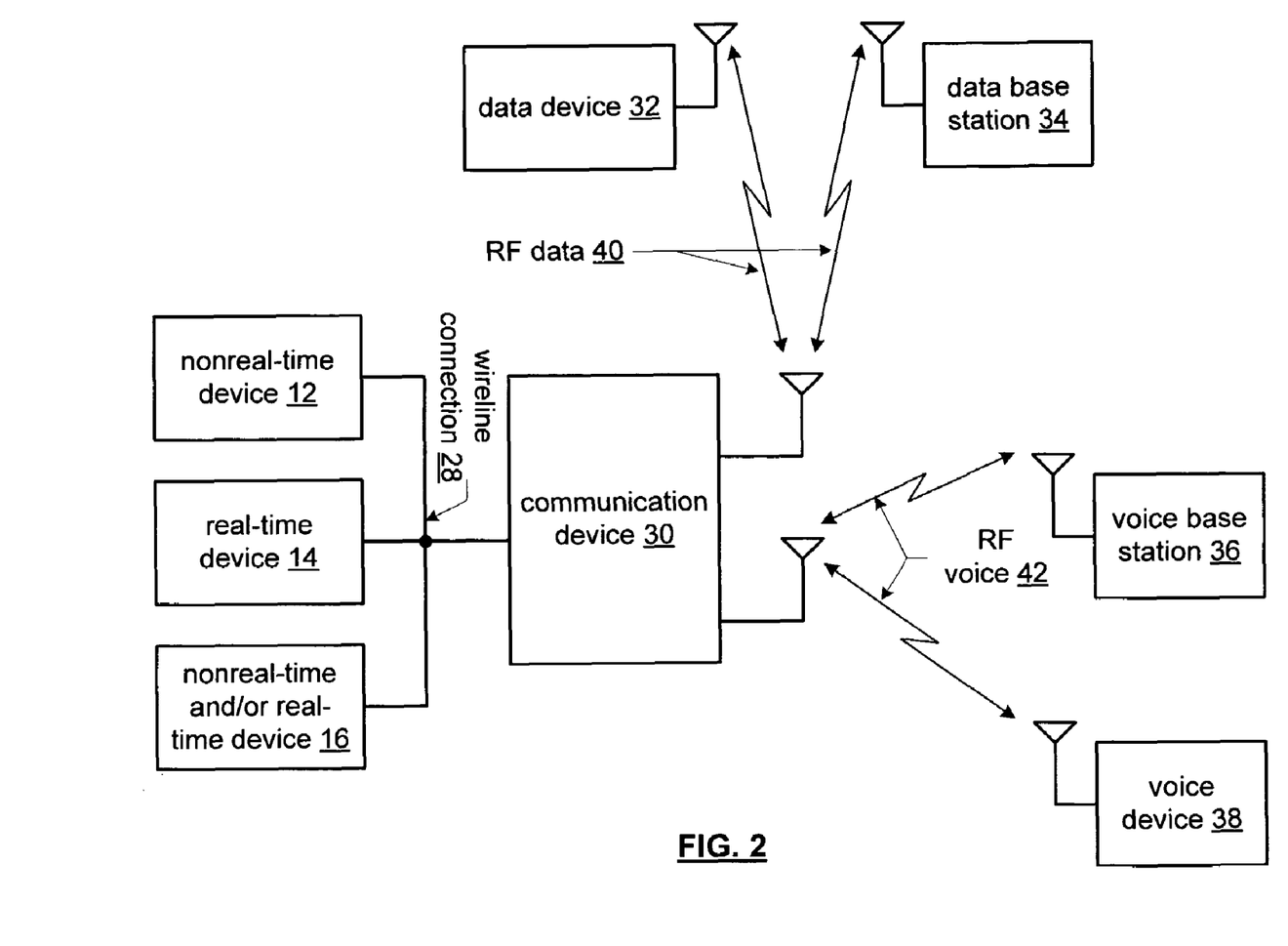
FIG. 2 is a schematic block diagram of an embodiment of another communication system in accordance with the present invention.

FIG. 2 is a schematic block diagram of an embodiment of another communication system in accordance with the present invention. In particular, FIG. 2 presents a communication system that includes many common elements of FIG. 1 that are referred to by common reference numerals. Communication device 30 is similar to communication device 10 and is capable of any of the applications, functions and features attributed to communication device 10, as discussed in conjunction with FIG. 1. However, communication device 30 includes two separate wireless transceivers for communicating, contemporaneously, via two or more wireless communication protocols with data device 32 and/or data base station 34 via RF data 40 and voice base station 36 and/or voice device 38 via RF voice signals 42.

Figure 3:
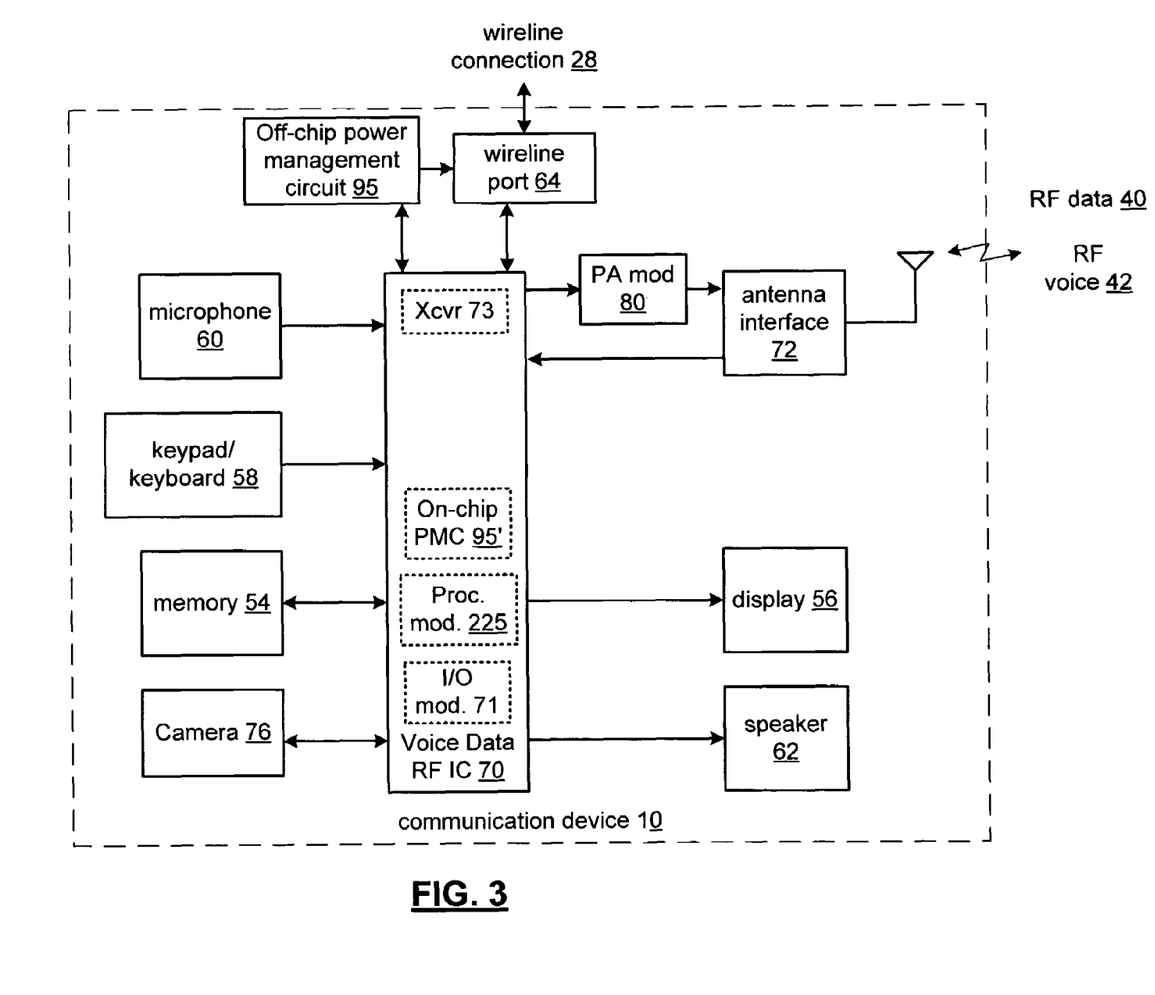
FIG. 3 is a schematic block diagram of an embodiment of an integrated circuit in accordance with the present invention.

FIG. 3 is a schematic block diagram of an embodiment of an integrated circuit in accordance with the present invention. In particular, a voice data RF integrated circuit (IC) 50 is shown that implements communication device 10 in conjunction with microphone 60, keypad/keyboard 58, memory 54, speaker 62, display 56, camera 76, antenna interface 52 and wireline port 64. In addition, voice data RF IC 50 includes a transceiver 73 with RF and baseband modules for formatting and modulating data and voice signals into RF real-time data 26 and non-real-time data 24 and transmitting this data via an off-chip power amplifier module 80 and antenna interface 72 and an antenna, and for receiving RF data and RF voice signals via the antenna. Further, voice data RF IC 50 includes an input/output module 71 with appropriate encoders and decoders for communicating via the wireline connection 28 via wireline port 64, an optional memory interface for communicating with off-chip memory 54, a codec for encoding voice signals from microphone 60 into digital voice signals, a keypad/keyboard interface for generating data from keypad/keyboard 58 in response to the actions of a user, a display driver for driving display 56, such as by rendering a color video signal, text, graphics, or other display data, and an audio driver such as an audio amplifier for driving speaker 62 and one or more other interfaces, such as for interfacing with the camera 76 or the other peripheral devices.

Off-chip power management circuit 95 includes one or more DC-DC converters, voltage regulators, current regulators or other power supplies for supplying the voice data RF IC 50 and optionally the other components of communication device 10 and/or its peripheral devices with supply voltages and or currents (collectively power supply signals) that may be required to power these devices. Off-chip power management circuit 95 can operate from one or more batteries, line power and/or from other power sources, not shown. In particular, off-chip power management module can selectively supply power supply signals of different voltages, currents or current limits or with adjustable voltages, currents or current limits in response to power mode signals received from the voice data RF IC 50. Voice Data RF IC 50 optionally includes an on-chip power management circuit 95' for replacing the off-chip power management circuit 95.

In an embodiment of the present invention, the voice data RF IC 50 is a system on a chip integrated circuit that includes at least one processing device. Such a processing device, for instance, processing module 225, may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices that are either on-chip or off-chip such as memory 54. Such a memory device may be a read-only memory, random access memory, volatile memory, non-volatile memory, static memory, dynamic memory, flash memory, and/or any device that stores digital information. Note that when the Voice Data RF IC 50 implements one or more of its functions via a state machine, analog circuitry, digital circuitry, and/or logic circuitry, the associated memory storing the corresponding operational instructions for this circuitry is embedded with the circuitry comprising the state machine, analog circuitry, digital circuitry, and/or logic circuitry.

In operation, the voice data RF IC 50 executes operational instructions that implement one or more of the applications (real-time or non-real-time) attributed to communication devices 10 and 30 as discussed in conjunction with FIGS. 1 and 2. Further, RF IC 50 includes modulation correction features in accordance with the present invention that will be discussed in greater detail in association with FIG. 5.

Figure 4:
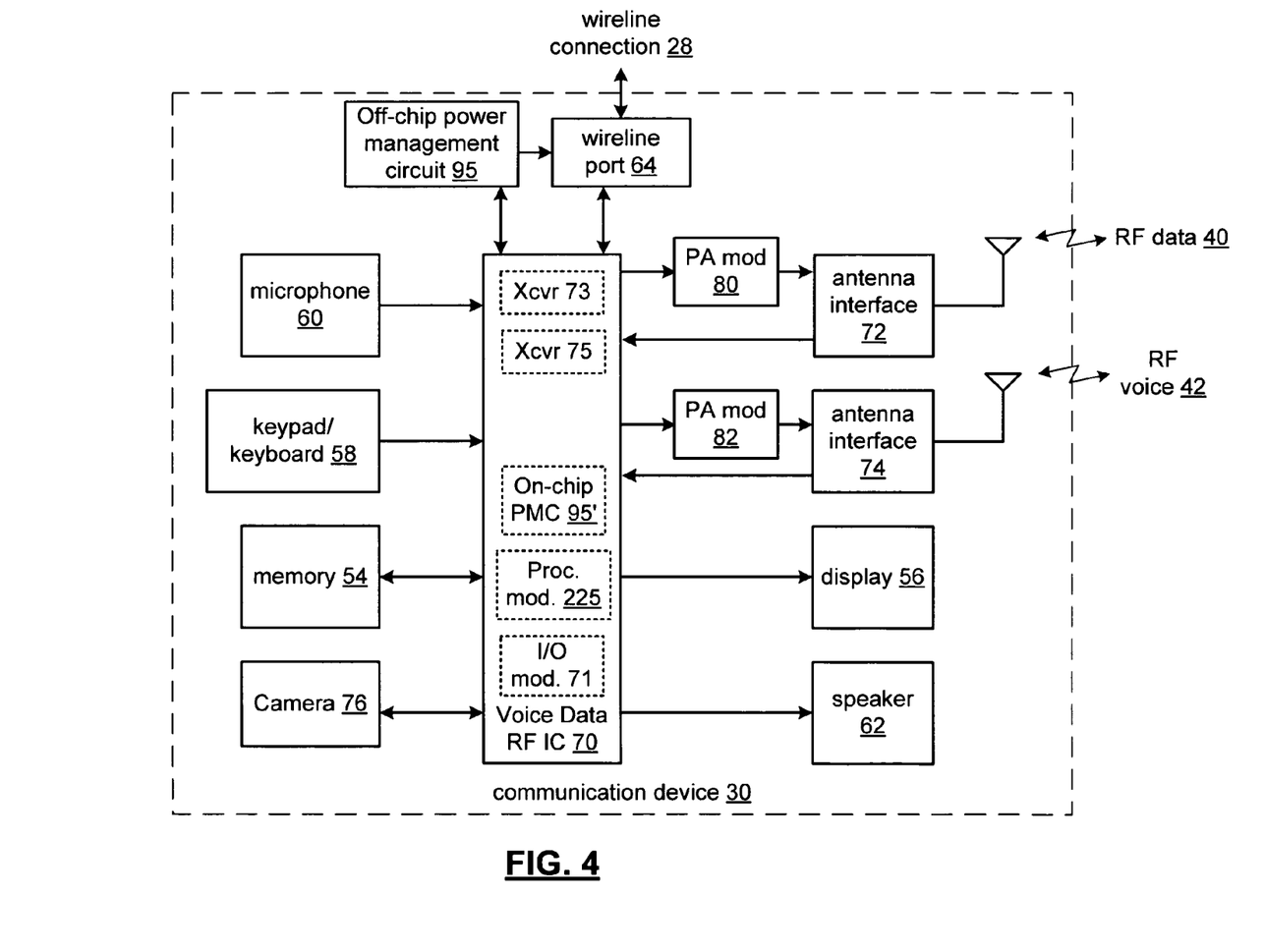
FIG. 4 is a schematic block diagram of another embodiment of an integrated circuit in accordance with the present invention.

FIG. 4 is a schematic block diagram of another embodiment of an integrated circuit in accordance with the present invention. In particular, FIG. 4 presents a communication device 30 that includes many common elements of FIG. 3 that are referred to by common reference numerals. Voice data RF IC 70 is similar to voice data RF IC 50 and is capable of any of the applications, functions and features attributed to voice data RF IC 50 as discussed in conjunction with FIG. 3. However, voice data RF IC 70 includes two separate wireless transceivers 73 and 75 for communicating, contemporaneously, via two or more wireless communication protocols via RF data 40 and RF voice signals 42.

In operation, the voice data RF IC 70 executes operational instructions that implement one or more of the applications (real-time or non-real-time) attributed to communication device 10 as discussed in conjunction with FIG. 1. Further, RF IC 70 includes modulation correction features in accordance with the present invention that will be discussed in greater detail in association with FIG. 5.

Figure 5:
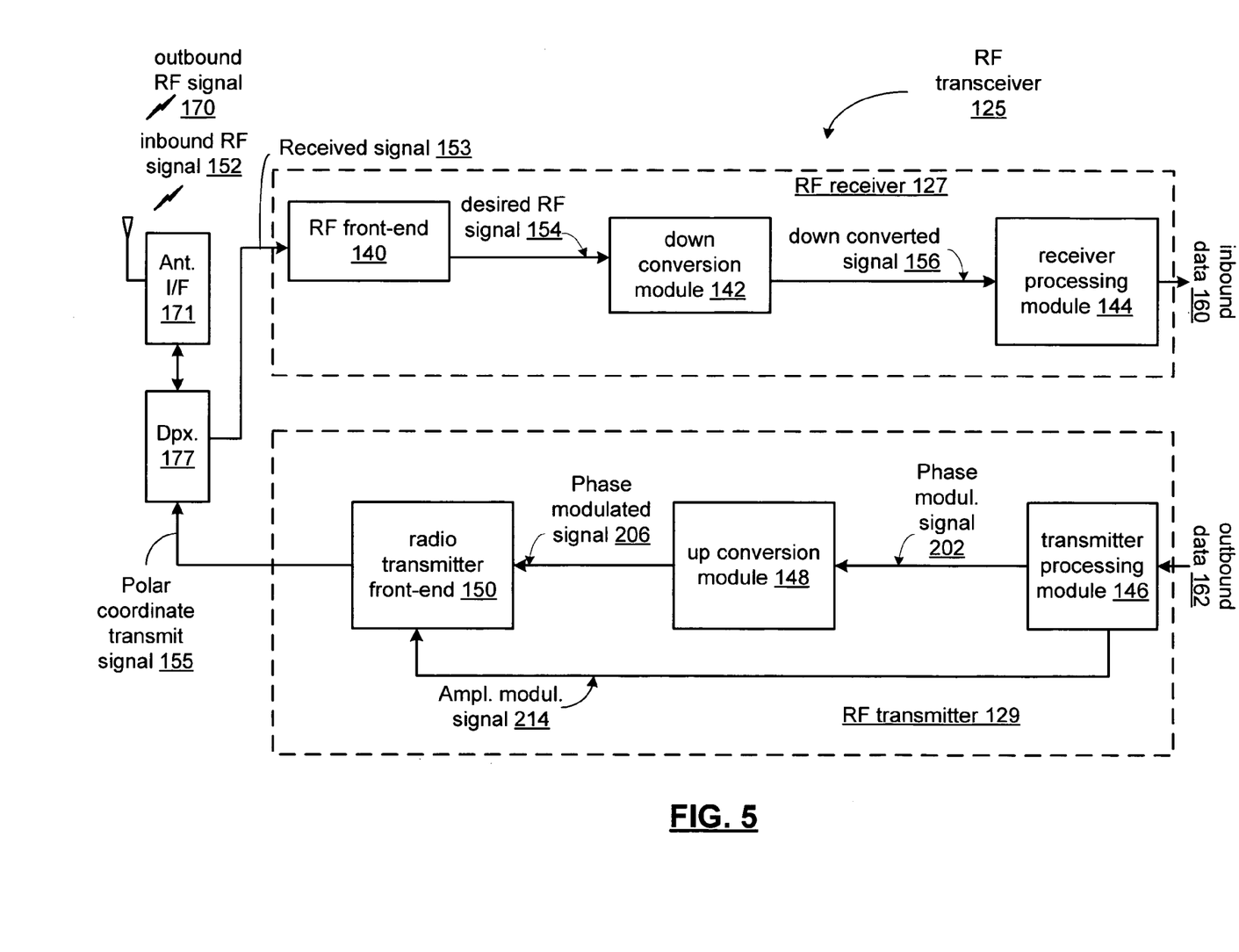
FIG. 5 is a schematic block diagram of an embodiment of an RF transceiver in accordance with the present invention.

FIG. 5 is a schematic block diagram of an RF transceiver 125, such as transceiver 73 or 75, which may be incorporated in communication devices 10 and/or 30. The RF transceiver 125 includes an RF transmitter 129, and an RF receiver 127. The RF receiver 127 includes an RF front end 140, a down conversion module 142, and a receiver processing module 144. The RF transmitter 129 includes a transmitter processing module 146, an up conversion module 148, and a radio transmitter front-end 150.

As shown, the transmitter is coupled to an antenna through off-chip antenna interface 171, such as antenna interface 72, and a diplexer (duplexer) 177, that couples the transmit signal 155 to the antenna to produce outbound RF signal 170 and couples inbound RF signal 152 to produce received signal 153. While a diplexer is shown, a transmit/receive switch could likewise be employed for the same purpose. While a single antenna is represented, the receiver and transmitter may each employ separate antennas or share a multiple antenna structure that includes two or more antennas. In another embodiment, the receiver and transmitter may share a multiple input multiple output (MIMO) antenna structure that includes a plurality of antennas. Each antenna may be fixed, programmable, an antenna array or other antenna configuration. Accordingly, the antenna structure of the wireless transceiver could also depend on the particular standard(s) to which the wireless transceiver is compliant and the applications thereof.

In operation, the transmitter receives outbound data 162 from a host device or other source via the transmitter processing module 146. The transmitter processing module 146 processes the outbound data 162 in accordance with a particular wireless communication standard (e.g., IEEE 802.11, Bluetooth, RFID, GSM, CDMA, et cetera) to produce baseband or low intermediate frequency (IF) transmit (TX) signals that include phase modulating signal 202 and amplitude modulation signal 214. The baseband or low IF TX signals may be digital baseband signals (e.g., have a zero IF) or digital low IF signals, where the low IF typically will be in a frequency range of one hundred kilohertz to a few megahertz.

In an embodiment of the present invention, the RF transmitter 129 produces a polar coordinate transmit signal 155 that includes a polar coordinate transmission having a carrier wave that is amplitude modulated and phase modulated by separate modulation signals. In this fashion, a portion of the outbound data 162 can be converted to processed data such as the phase modulating signal 202 for phase modulation by up conversion module 148 and the remaining outbound data can be converted into amplitude modulating signal 214 for amplitude modulation by the radio transmitter front-end 150.

Note that the processing performed by the transmitter processing module 146 can include, but is not limited to, scrambling, encoding, puncturing, mapping, modulation, and/or digital baseband to IF conversion. Further note that the transmitter processing module 146 may be implemented using a shared processing device, individual processing devices, or a plurality of processing devices and may further include memory. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, and/or any device that stores digital information. Note that when the processing module 146 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

The up conversion module 148 can includes a digital-to-analog conversion (DAC) module, a filtering and/or gain module, and an up-conversion section. The DAC module converts the baseband or low IF TX signals 164 from the digital domain to the analog domain. The filtering and/or gain module filters and/or adjusts the gain of the analog signals prior to providing it to the up-conversion section. The up-conversion section converts the analog baseband or low IF signals into up converted signals such as phase modulated signal 206. As discussed above, the up conversion module 148 phase modulates an RF carrier frequency based on the phase modulating signal 202, to produce the phase modulated signal 206. In an embodiment of the present invention a phase locked loop circuit or other phase modulator is used for this purpose. Up conversion module 148 optionally includes a limiter circuit for leveling the amplitude of phase modulated signal 206 prior to amplitude modulation by the radio frequency front end 150.

The radio transmitter front end 150 includes a polar coordinate amplifier that amplifies and the phase modulated signal 206 and that amplitude modulates this signal with the amplitude modulating signal 214 to produce the polar coordinate transmit signal 155 and optionally includes a transmit filter module. The antenna structure transmits outbound RF signals 170, based on the polar coordinate transmit signal 155 to a targeted device such as a RF tag, base station, an access point and/or another wireless communication device via an antenna interface 171 coupled to an antenna that provides impedance matching and optional bandpass and/or notch filtration. Radio transmitter front-end 150 corrects for nonlinearities or other errors produced during amplitude modulation. Further operation of the radio transmitter front-end 150 will be discussed in conjunction with FIGS. 6-10 that follow.

The receiver receives inbound RF signals 152 via the antenna and off-chip antenna interface 171 that operates to process the inbound RF signal 152 into received signal 153 for the receiver front-end 140. In general, antenna interface 171 provides impedance matching of antenna to the RF front-end 140 and optional bandpass and/or notch filtration of the inbound RF signal 152.

The down conversion module 70 includes a mixing section, an analog to digital conversion (ADC) module, and may also include a filtering and/or gain module. The mixing section converts the desired RF signal 154 into a down converted signal 156 that is based on a receiver local oscillation 158, such as an analog baseband or low IF signal. The ADC module converts the analog baseband or low IF signal into a digital baseband or low IF signal. The filtering and/or gain module high pass and/or low pass filters the digital baseband or low IF signal to produce a baseband or low IF signal 156. Note that the ordering of the ADC module and filtering and/or gain module may be switched, such that the filtering and/or gain module is an analog module.

The receiver processing module 144 processes the baseband or low IF signal 156 in accordance with a particular wireless communication standard (e.g., IEEE 802.11, Bluetooth, RFID, GSM, CDMA, et cetera) to produce inbound data 160. The processing performed by the receiver processing module 144 includes, but is not limited to, digital intermediate frequency to baseband conversion, demodulation, demapping, depuncturing, decoding, and/or descrambling. Note that the receiver processing modules 144 may be implemented using a shared processing device, individual processing devices, or a plurality of processing devices and may further include memory. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, and/or any device that stores digital information. Note that when the receiver processing module 144 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

Figure 6:
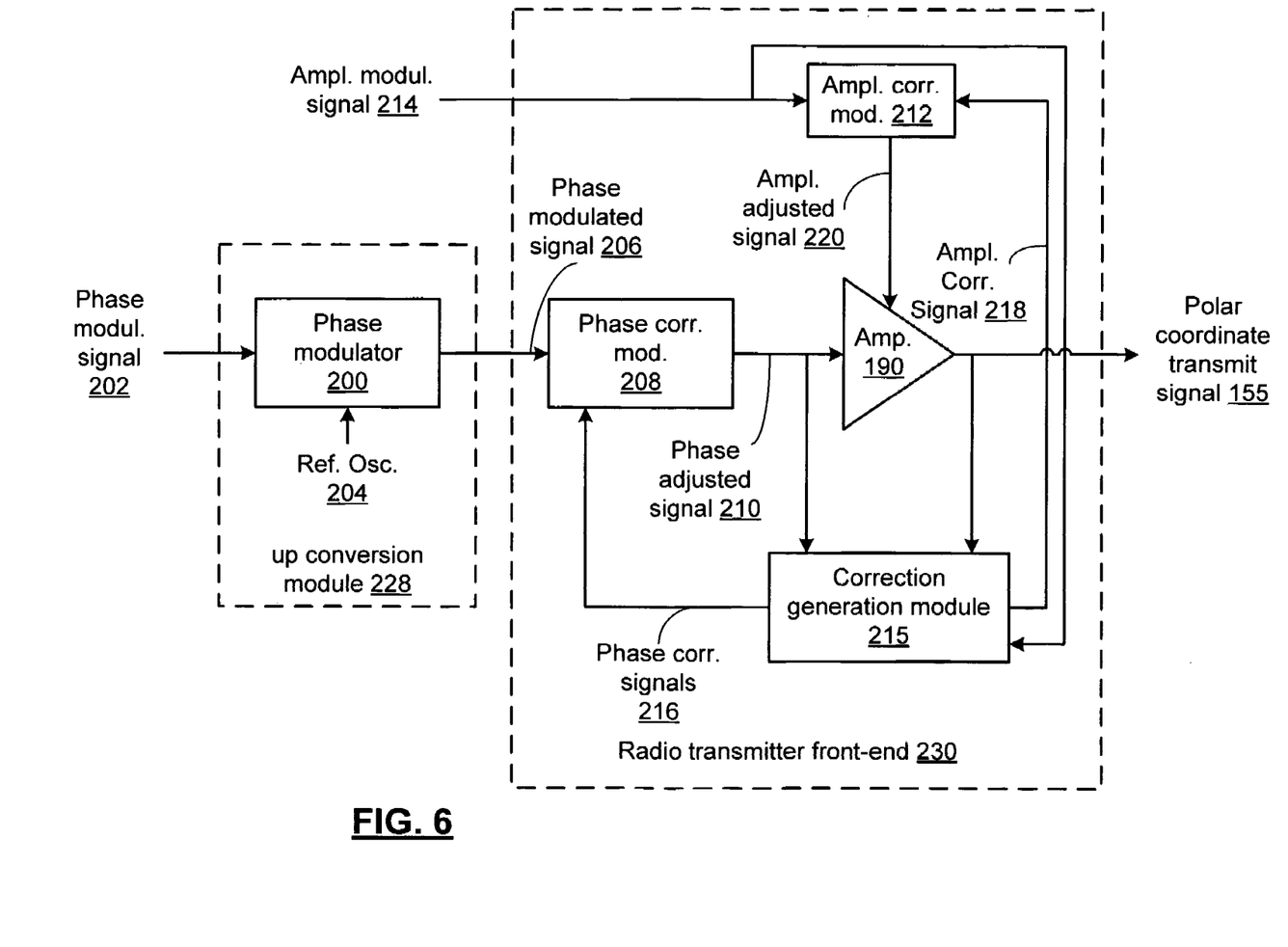
FIG. 6 is a schematic block diagram of an embodiment of a radio transmitter front-end and up conversion module in accordance with the present invention.

FIG. 6 is a schematic block diagram of an embodiment of a radio transmitter front-end and up conversion module in accordance with the present invention. In particular, phase modulated signal 206 is generated by phase modulator 200 of up conversion module 228, such as up conversion module 148, based on a reference oscillation 204 at the carrier frequency or some multiple or division thereof. Phase correction module 208 produces a phase adjusted signal 210 in response to phase modulated signal 206 and one or more phase correction signals 218. Amplitude correction module 212 produces an amplitude adjusted signal 220 in response to amplitude modulating signal 214 and an amplitude correction signal 218. Amplifier 190 amplifies the phase adjusted signal 210 and amplitude modulates the amplified phase adjusted signal 210 based on the amplitude adjusted signal 220, to produce polar coordinate transmit signal 155. Correction generation module 215 generates the phase correction signals 216 and the amplitude correction signal 218 based on the polar coordinate transmit signal 155, the phase adjusted signal 210 and the amplitude modulating signal 214.

In an embodiment of the present invention, the phase adjusted signal 210 can be represented by $\sin(\omega_{rf}t+\phi(t))$, where $\omega_{rf}$ represents the carrier frequency and $\phi(t)$ represents the phase modulating signal 202. Without the corrections produced by correction generation module 215 (with this module disabled), the polar coordinate transmit signal 155 can be represented by $(A(t)+\Delta A(t))\sin(\omega_{rf}t+\phi(t)+\Delta\phi(t))$, where $A(t)$ represents the amplitude modulating signal 214, $\Delta A(t)$ represents an amplitude modulation error introduced by the amplifier 190 and $\Delta\phi(t)$ represents a phase modulation error introduced by the amplifier 190. In particular, $\Delta A(t)$ and $\Delta\phi(t)$ can be dependent upon, such as a function of, the value of $A(t)$. In operation, correction generation module 215 calculates the in-phase and quadrature phase products of the phase adjusted signal 210 and the polar coordinate transmit signal 155 to produce the low frequency product terms $(A(t)+\Delta A(t))\sin(\Delta\phi(t))$ and $(A(t)+\Delta A(t))\cos(\Delta\phi(t))$.

Taking the sum of the squares of these terms yields $(A(t)+\Delta A(t))$ that, when $A(t)$ is subtracted isolates the amplitude modulation error $\Delta A(t)$. When the amplitude correction signal 218 is assigned to be $\Delta A(t)$ and this value is subtracted from the amplitude modulating signal 214 by amplitude correction module 212 to form amplitude adjusted signal 220, the amplitude modulation error can be corrected or substantially corrected. In an embodiment of the present invention amplitude correction module 212 includes a combiner such as an adder that sums or subtracts the amplitude modulating signal 214 with the amplitude correction signal (based on their respective polarities) to form an amplitude adjusted signal $(A(t)-\Delta A(t))$.

In addition, the low frequency product terms $(A(t)+\Delta A(t))\sin(\Delta\phi(t))$ and $(A(t)+\Delta A(t))\cos(\Delta\phi(t))$ can be divided by the amplitude term $(A(t)+\Delta A(t))$ to produce in-phase gain signal $\sin(\Delta\phi(t))$ and quadrature-phase gain signal $\cos(\Delta\phi(t))$ that can supplied to phase correction module 208 as phase correction signals 216 and used to correct or substantially correct for the phase modulation error term $\Delta\phi(t)$ in the phase adjusted signal 210. A specific embodiment of the phase correction module 208 is presented in conjunction with FIG. 8.

Figure 7:
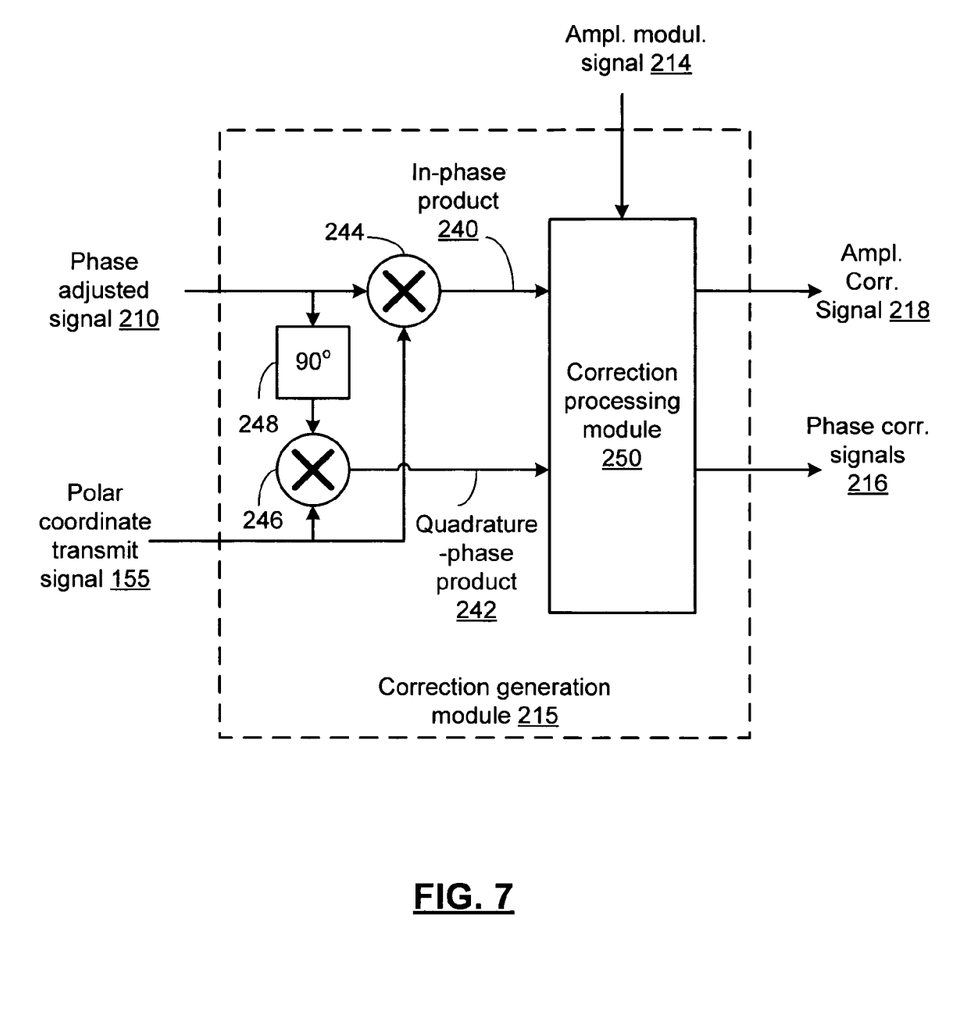
FIG. 7 is a schematic block diagram of an embodiment of a correction generation module in accordance with the present invention.

FIG. 7 is a schematic block diagram of an embodiment of a correction generation module in accordance with the present invention. In particular, correction generation module 215 is presented that can operate as described in conjunction with FIG. 6 producing an in-phase product 240 of the phase adjusted signal 210 and the polar coordinate transmit signal 155, and a quadrature-phase product 242 of the phase adjusted signal 210 and the polar coordinate transmit signal 155 via phase shift network 248, and mixers 244 and 246 that optionally include filtration to attenuate the high frequency terms. Correction processing module 250 produces amplitude correction signal 218 and phase correction signals 216 that include an in-phase gain signal and quadrature-phase gain signal, such as described in conjunction with FIG. 6, based on the amplitude modulating signal 214, and the in-phase and quadrature-phase products 240 and 242.

In an embodiment of the present invention, correction processing module 250 can be implemented using a shared processing device, individual processing devices, or a plurality of processing devices and may further include memory. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, and/or any device that stores digital information. Note that when the correction processing module 250 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

Figure 8:
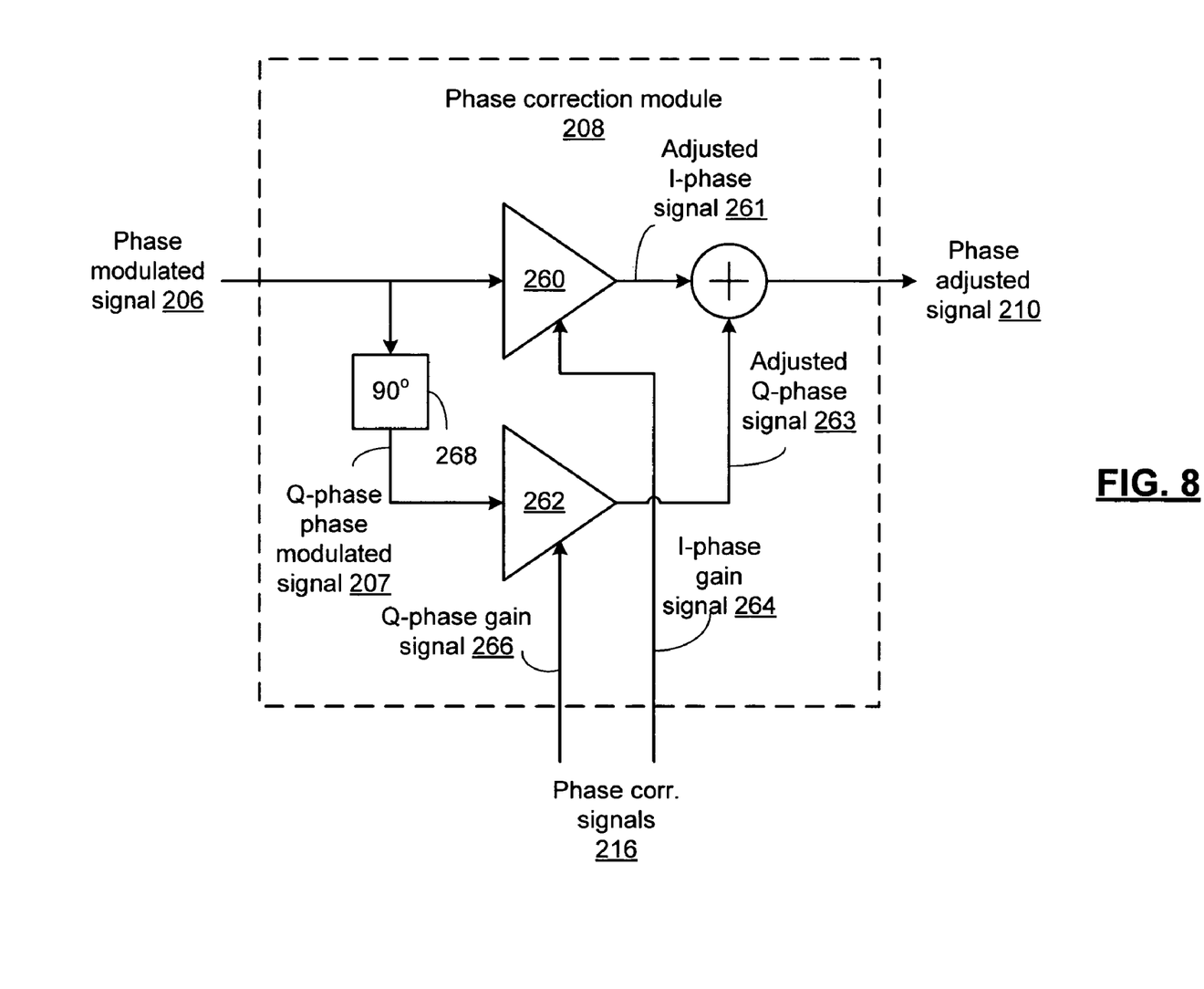
FIG. 8 is a schematic block diagram of an embodiment of a phase correction module in accordance with the present invention.

FIG. 8 is a schematic block diagram of an embodiment of a phase correction module in accordance with the present invention. In particular, phase correction module 208 includes an in-phase driver 260 having a gain that is controlled by the in-phase gain signal 264 and that produces an adjusted in-phase signal 261 from the phase modulated signal 206. Phase correction module further includes a quadrature-phase driver 262 having a gain that is controlled by the quadrature-phase gain signal 266 and that produces an adjusted quadrature-phase signal 263 from a quadrature-phase phase modulated signal 207 formed by phase shift network 268. Phase correction module 208 produces the phase adjusted signal 210 based on the sum of the adjusted in-phase signal 261 and the adjusted quadrature-phase signal 263.

In an embodiment of the present invention, the quadrature-phase driver 262 is implemented with a lower power circuit than the in-phase driver 260, in particular when the phase modulation error is small in comparison with the magnitude of the phase modulated signal 206.

Figure 9:
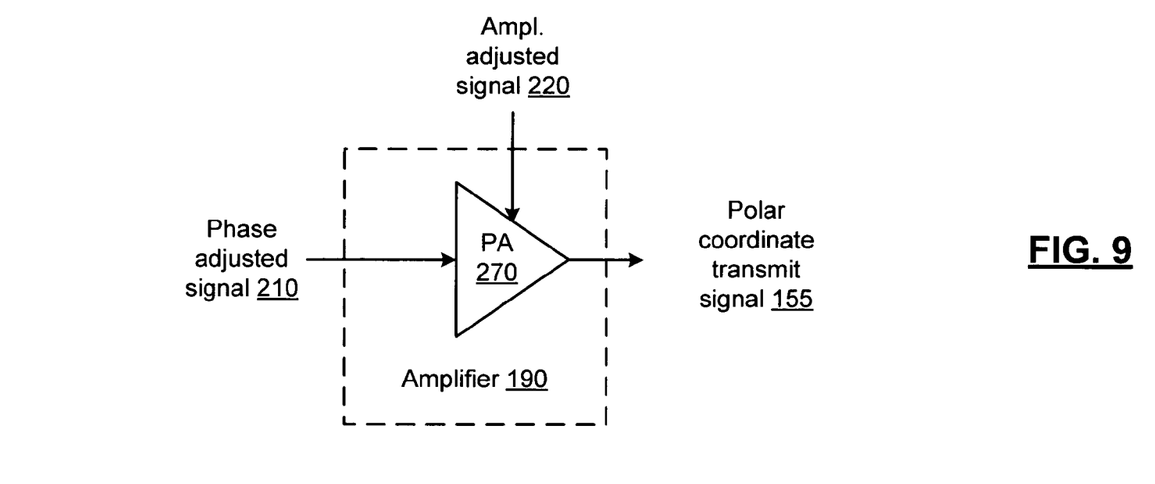
FIG. 9 is a schematic block diagram of an embodiment of an amplifier in accordance with the present invention.

FIG. 9 is a schematic block diagram of an embodiment of an amplifier in accordance with the present invention. In particular, amplifier 190 includes a power amplifier 270 that can be implemented as part of voice, data and RF IC 50 or 70 as shown in conjunction with FIG. 5 or optionally can be implemented off-chip for greater power generation, or to save space on voice, data and RF IC 50 or 70 or to reduce noise coupling with voice, data and RF IC 50 or 70.

Figure 10:
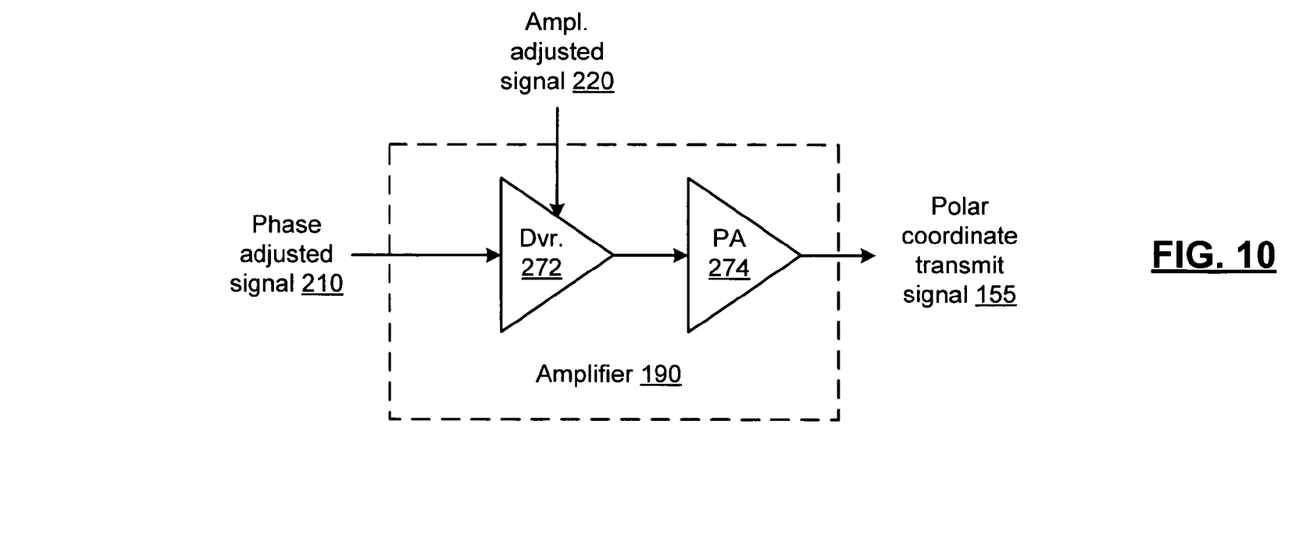
FIG. 10 is a schematic block diagram of another embodiment of an amplifier in accordance with the present invention.

FIG. 10 is a schematic block diagram of another embodiment of an amplifier in accordance with the present invention. In particular, amplifier 190 includes driver 272 for driving a separate power amplifier 274, wherein the driver is used to generate the amplitude modulation based on amplitude adjusted signal 220. In this embodiment, driver 272 is implemented on voice, data and RF IC 50 or 70 and power amplifier 274 can be implemented either on-chip of off-chip, based on design considerations such as those discussed in conjunction with FIG. 9.

Figure 11:
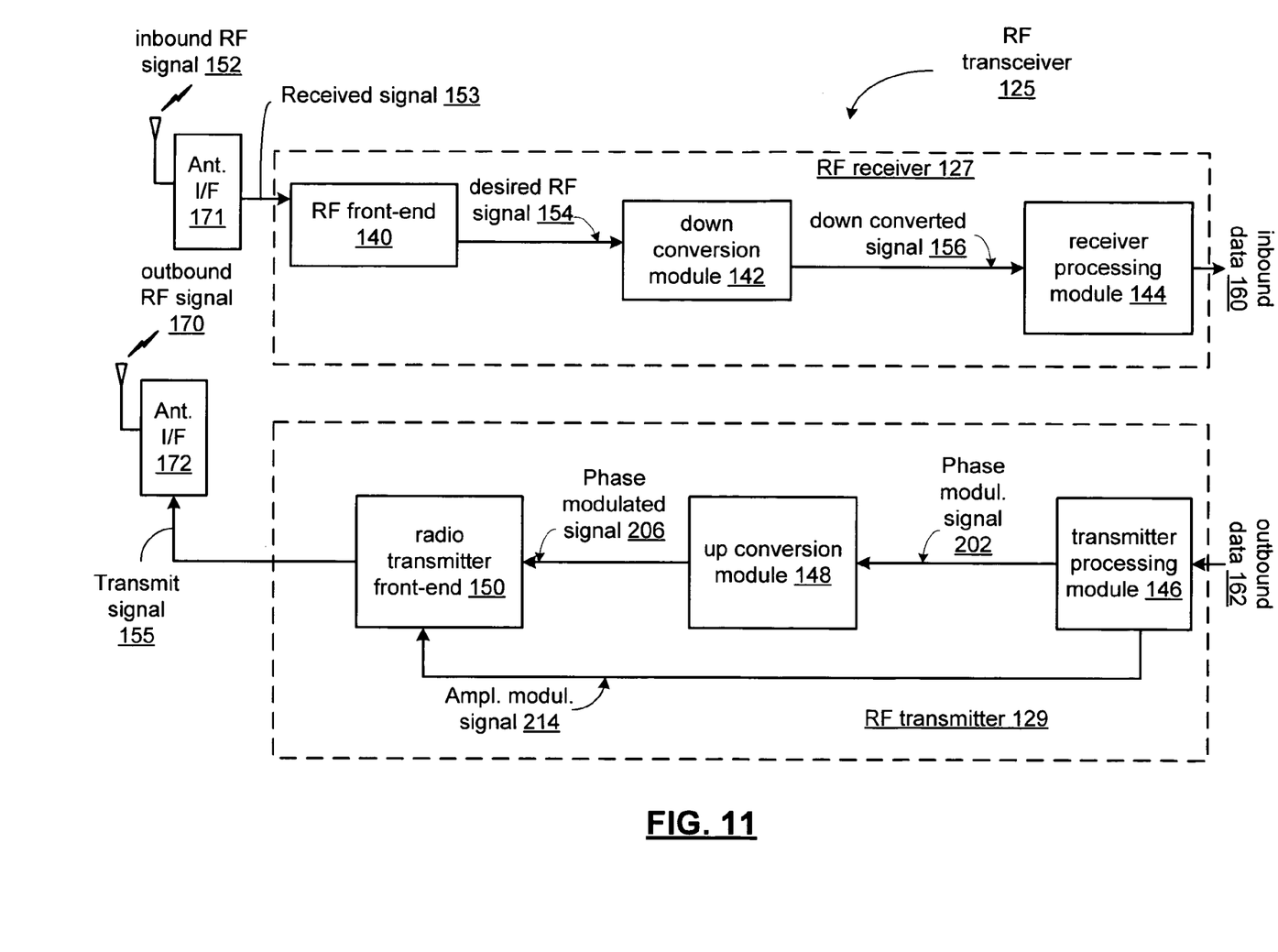
FIG. 11 is a schematic block diagram of another embodiment of a RF transceiver in accordance with the present invention.

FIG. 11 is a schematic block diagram of another embodiment of a RF transceiver in accordance with the present invention. In particular, an embodiment is shown that includes similar elements discussed in conjunction with FIG. 5 that are referred to by common reference numerals. Instead of duplexer 177, RF transmitter 129 and RF receiver 127 have dedicated antennas and/or antenna systems that are coupled through antenna interfaces 171 and 172 that can be implemented in a similar fashion.

Figure 12:
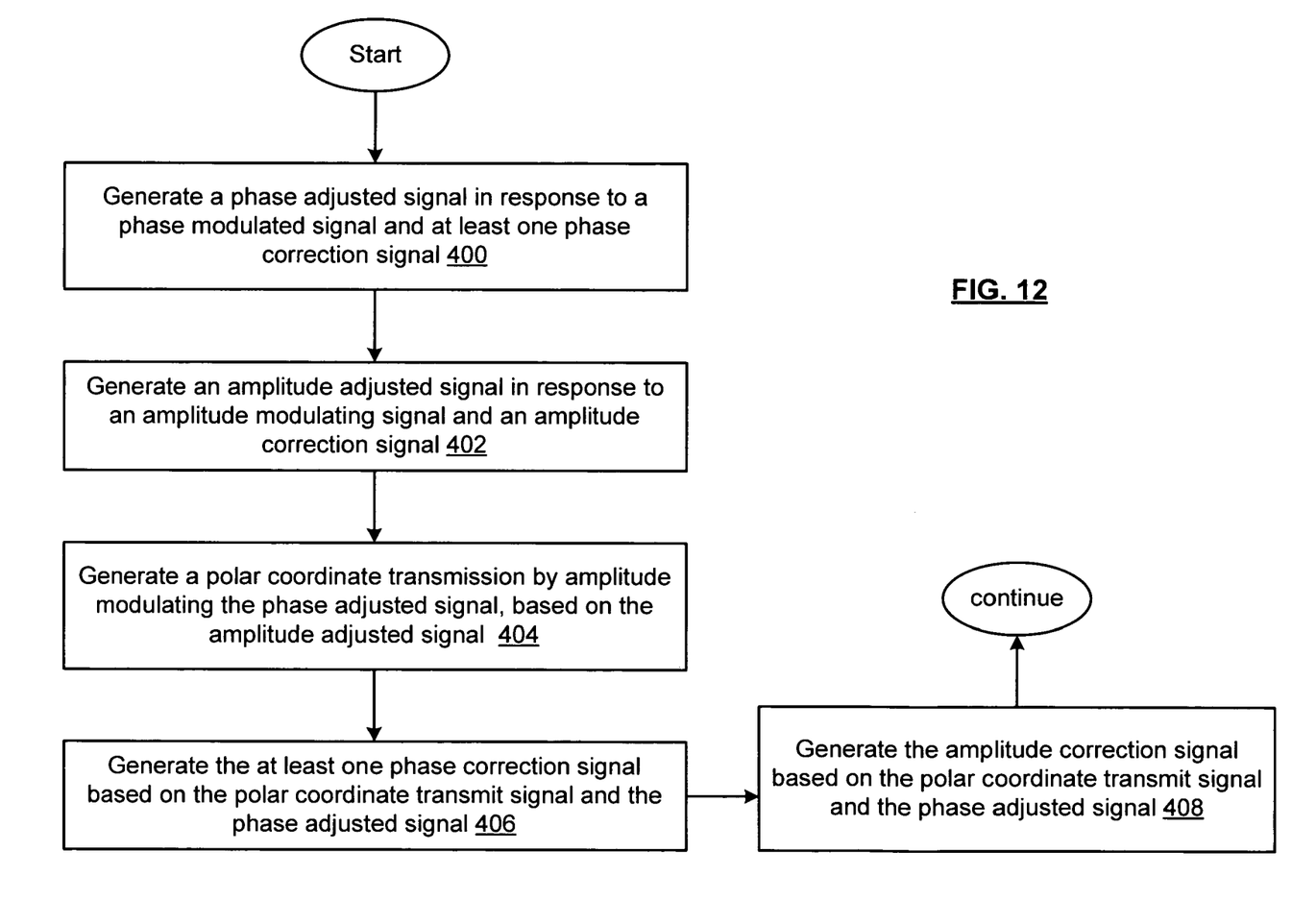
FIG. 12 is a flow chart of an embodiment of a method in accordance with the present invention.

FIG. 12 is a flow chart of an embodiment of a method in accordance with the present invention. In particular, a method is presented for use in conjunction with one or more of the functions and features described in conjunction with FIGS. 1-11. In step 400, a phase adjusted signal is generated in response to a phase modulated signal and at least one phase correction signal. In step 402, an amplitude adjusted signal is generated in response to an amplitude modulating signal and an amplitude correction signal. In step 404, a polar coordinate transmit signal is generated by amplitude modulating the phase adjusted signal, based on the amplitude adjusted signal. In step 406, one or more phase correction signals are generated based on the polar coordinate transmit signal and the phase adjusted signal. In step 408, the amplitude correction signal is generated based on the polar coordinate transmit signal and the phase adjusted signal.

In an embodiment of the present invention step 402 includes combining the amplitude correction signal with the amplitude modulating signal to produce the amplitude adjusted signal by one of, adding and subtracting.

Step 406 can include producing an in-phase product of the phase adjusted signal and the polar coordinate transmit signal, and a quadrature-phase product of the phase adjusted signal and the polar coordinate transmit signal, producing an in-phase phase gain from the in-phase product, and a quadrature-phase phase gain from the quadrature-phase product, and wherein the at least one phase correction signal includes the in-phase gain signal and the quadrature-phase gain signal. Step 406 can also include producing an adjusted in-phase signal from the phase modulated signal by amplifying the phase modulated signal by a gain that is controlled by the in-phase gain signal. Step 406 can also include producing an adjusted quadrature-phase signal from a quadrature-phase phase modulated signal by amplifying the quadrature-phase phase modulated signal by a gain that is controlled by the quadrature-phase gain signal. Step 406 can also include producing the phase adjusted signal based on the sum of the adjusted in-phase signal and the adjusted quadrature-phase signal.

Step 408 can include producing an in-phase product of the phase adjusted signal and the polar coordinate transmit signal, and a quadrature-phase product of the phase adjusted signal and the polar coordinate transmit signal. Step 408 can further include generating the amplitude correction signal based on the sum of the squares of the in-phase product and the quadrature-phase product.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. While the term phase modulation is used herein it includes the equivalent frequency modulation.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A radio transmitter front-end for use in a voice data and RF integrated circuit (IC) comprising:
    a phase correction module that produces a phase adjusted signal in response to a phase modulated signal and at least one phase correction signal;
    an amplitude correction module, that produces an amplitude adjusted signal in response to an amplitude modulating signal and an amplitude correction signal;
    an amplifier, coupled to the phase correction module and the amplitude correction modulate, that amplifies the phase adjusted signal and amplitude modulates the phase adjusted signal, based on the amplitude adjusted signal, to produce a polar coordinate transmit signal;
    a correction generation module, coupled to the phase correction module, the amplifier and the amplitude correction module, that generates the at least one phase correction signal and the amplitude correction signal, based on the polar coordinate transmit signal and the phase adjusted signal.

2. The radio transmitter front-end of claim 1 wherein the amplitude correction module combines the amplitude correction signal with the amplitude modulating signal to produce the amplitude adjusted signal by one of, adding and subtracting.

3. The radio transmitter front-end of claim 1 wherein the correction generation module produces an in-phase product of the phase adjusted signal and the polar coordinate transmit signal, and a quadrature-phase product of the phase adjusted signal and the polar coordinate transmit signal.

4. The radio transmitter front-end of claim 3 wherein the correction generation module produces an in-phase phase gain from the in-phase product and a quadrature-phase phase gain from the quadrature-phase product, and wherein the at least one phase correction signal includes the in-phase gain signal and the quadrature-phase gain signal.

5. The radio transmitter front-end of claim 4 wherein the phase correction module includes an in-phase driver having a gain that is controlled by the in-phase gain signal and that produces an adjusted in-phase signal from the phase modulated signal.

6. The radio transmitter front-end of claim 5 wherein the phase correction module includes a quadrature-phase driver having a gain that is controlled by the quadrature-phase gain signal and that produces an adjusted quadrature-phase signal from a quadrature-phase phase modulated signal.

7. The radio transmitter front-end of claim 6 wherein the quadrature-phase driver is implemented with a lower power circuit than the in-phase driver.

8. The radio transmitter front-end of claim 6 wherein the phase correction module produces the phase adjusted signal based on the sum of the adjusted in-phase signal and the adjusted quadrature-phase signal.

9. The radio transmitter front-end of claim 3 wherein the correction generation module produces the amplitude correction signal based on the sum of the squares of the in-phase product and the quadrature-phase product.

10. The radio transmitter front-end of claim 1 wherein the amplifier is implemented on the voice data and RF IC.

11. The radio transmitter front-end of claim 1 wherein the amplifier is implemented off the voice data and RF IC.

12. The radio transmitter front-end of claim 1 wherein the amplifier includes a power amplifier.

13. The radio transmitter front-end of claim 1 wherein the amplifier includes driver for driving a separate power amplifier.

14. A method comprising:
    generating a phase adjusted signal in response to a phase modulated signal and at least one phase correction signal;
    generating an amplitude adjusted signal in response to an amplitude modulating signal and an amplitude correction signal;
    generating a polar coordinate transmit signal by amplitude modulating the phase adjusted signal, based on the amplitude adjusted signal;
    generating the at least one phase correction signal based on the polar coordinate transmit signal and the phase adjusted signal; and
    generating the amplitude correction signal based on the polar coordinate transmit signal and the phase adjusted signal.

15. The method of claim 14 wherein the step of generating the amplitude adjusted signal includes combining the amplitude correction signal with the amplitude modulating signal to produce the amplitude adjusted signal by one of, adding and subtracting.

16. The method of claim 14 wherein the step of generating the at least one phase correction signal includes producing an in-phase product of the phase adjusted signal and the polar coordinate transmit signal, and a quadrature-phase product of the phase adjusted signal and the polar coordinate transmit signal.

17. The method of claim 16 wherein the step of generating the at least one phase correction signal includes producing an in-phase phase gain from the in-phase product, and a quadrature-phase phase gain from the quadrature-phase product, and wherein the at least one phase correction signal includes the in-phase gain signal and the quadrature-phase gain signal.

18. The method of claim 17 wherein the step of generating the at least one phase correction signal includes producing an adjusted in-phase signal from the phase modulated signal by amplifying the phase modulated signal by a gain that is controlled by the in-phase gain signal.

19. The method of claim 18 wherein the step of generating the at least one phase correction signal includes producing an adjusted quadrature-phase signal from a quadrature-phase phase modulated signal by amplifying the quadrature-phase phase modulated signal by a gain that is controlled by the quadrature-phase gain signal.

20. The method of claim 19 wherein the step of generating the at least one phase correction signal includes producing the phase adjusted signal based on the sum of the adjusted in-phase signal and the adjusted quadrature-phase signal.

21. The method of claim 14 wherein the step of generating the amplitude correction signal includes producing an in-phase product of the phase adjusted signal and the polar coordinate transmit signal, and a quadrature-phase product of the phase adjusted signal and the polar coordinate transmit signal.

22. The method of claim 21 wherein the step of generating the amplitude correction signal generates the amplitude correction signal based on the sum of the squares of the in-phase product and the quadrature-phase product.

* * * * *